United States Patent [19]
Hamada et al.

[11] Patent Number: 5,889,322
[45] Date of Patent: Mar. 30, 1999

[54] LOW-TEMPERATURE CALCINED CERAMICS

[75] Inventors: Noriaki Hamada; Kouichi Yamaguchi; Hideto Yonekura; Kenichi Nagae, all of Kokubu, Japan

[73] Assignee: Kyocera Corporation, Kyoto, Japan

[21] Appl. No.: 980,703

[22] Filed: Dec. 1, 1997

[30] Foreign Application Priority Data

Nov. 29, 1996 [JP] Japan .................................. 8-320427
Dec. 2, 1996 [JP] Japan .................................. 8-322038

[51] Int. Cl.$^6$ .......................... H01L 23/053; H01L 23/12
[52] U.S. Cl. ............................................ 257/701; 257/703
[58] Field of Search ..................................... 257/701, 703

[56] References Cited

U.S. PATENT DOCUMENTS

4,966,742  10/1990  Khoury et al. .
5,332,701   7/1994  Bryson et al. .
5,504,371   4/1996  Nimi et al. .
5,686,172  11/1997  Ohya et al. .

*Primary Examiner*—Carl Whitehead, Jr.
*Assistant Examiner*—S. V. Clark
*Attorney, Agent, or Firm*—Loeb & Loeb LLP

[57] ABSTRACT

A low-temperature calcined ceramic of the present invention comprises a sintered body obtained by calcining a mixture of a glass and an $SiO_2$ filler such as quartz or cristobalite, wherein the sintered body contains an $SiO_2$ crystal having an X-ray diffraction image that the peak at the (101) plane of quartz or cristobalite is shifted at least 0.05° (2θ) to the lower angle side. The ceramic containing the shifted crystal of quarts or cristobalite does not have a region of abruptly changing the thermal expansion and has a substantially linear thermal expansion curve. Accordingly, when the ceramic is used as an insulating substrate of a wiring boad, there is no possibility of abruptly causing the thermal expansion by heating, etc., at mounting on an external electric circuit boad and the occurrence of the inferior connection, etc., by thermal expansion can be effectively prevented.

7 Claims, 2 Drawing Sheets

LOW-TEMPERATURE CALCINED CERAMICS

BACKGROUND OF THE INVENTION

1. Field of the Invention

The present invention relates to a low-temperature calcined ceramic which can be simultaneously molded with a metallized wiring layer by a metal such as Cu, Ag, etc, and more specifically to a low-temperature calcined ceramic the abrupt change of the thermal expansion of which is restrained. The present invention also relates to a wiring boad using the above-described low-temperature calcined ceramic and a mounted structure of a package for accommodating a semiconductor.

2. Description of the Prior Art

A wiring board, in general, has a structure in which a metallized wiring layer is arranged on the surface of, or in the inside of, an insulating board. A representative example of the wiring board will be a package for accommodating semiconductor elements and, particularly, a package for accommodating semiconductor integrated circuit elements such as LSIs (large-scale integrated circuit elements). In such a package, in general, recessed portions for accommodating semiconductor elements are formed in the surface of the insulating board composed of alumina ceramics, and a plurality of metallized wiring layers composed of a powder of a high-melting metal such as tungsten, molybdenum, etc. are arranged on the surface and inside the insulating board, and are electrically connected to the semiconductor elements accommodated in the recessed portions. On the lower surface or on the side surfaces of the insulating board are further provided connection terminals for electric connection to the mother board, the connection terminals being electrically connected to the metallized wiring layers. That is, the package for accommodating semiconductor elements is mounted upon electrically connecting the connection terminals, by brazing using a solder or the like, to the wiring conductors formed on the surface of the mother board.

Here, the number of electrodes formed on the semiconductor element increases with an increase in the degree of integration of the semiconductor element and, hence, the number of connection terminals provided on the package increases, too. Furthermore, the size of the package must be increased with an increase in the number of the electrodes. To meet the requirement for decreasing the size of the packages, however, it is also necessary to increase the number of the connection terminals per a package (i.e., to increase the density of the connection terminals).

Most generally, the connection terminals of the conventional packages for accommodating semiconductor elements are in the form of a pin grid array (PGA) in which metal pins such as of Kovar are connected to the lower surfaces of the packages. Furthermore, the surface mounting-type packages include a quad flat package (QFP) in which an L-shaped metal member is brazed to the metallized wiring layer drawn onto the side surface of the package, a leadless chip carrier (LCC) having electrode pads on the four side surfaces of the package but without having lead pins, and a ball grid array (BGA) in which spherical terminals composed of a brazing material such as solder are provided on the lower surface of the insulating board. Among them, it has been said that the BGA enables the connection terminals to be formed most highly densely.

In the BGA, the spherical terminals are brazed to the connection pads, and are placed on, and are contacted to, the wiring conductors of the mother board. In this state, the spherical terminals are heated and melted at a temperature of about 250° to 400° C. and are joined to the wiring conductors, so that the BGA is mounted on the mother board. Owing to such a mounting structure, the electrodes of the semiconductor element contained in the package are electrically connected to the mother board via metallized wiring layers and the connection terminals.

The insulating boards used for the packages have heretofore been composed of ceramics such as alumina, mullite, etc. The ceramic insulating board has a strength which is as high as not smaller than 200 MPa and offers such an advantage that the metallized wiring layers can be formed in a multiplicity of layers.

However, a ceramics such as alumina, mullite, etc., have a disadvantage that because the calcination temperature thereof is high as 1500° C. or higher, for the insulating substrate made up of such a ceramic, a metal which has a low conductor resistance and is relatively inexpensive, such as Cu, Ag, etc., cannot be used as the wiring layer.

Thus, various insulating materials composed of sintered materials such as glass, ceramics and the like, which can be calcined at a low temperature and can use a metal such as Cu, Ag and the like as a wiring layer, are proposed as described, for example, in JP-A-50-119814, JP-A-58-176651 (the term "JP-A" as used herein means an "unexamined published Japanese patent application"), JP-B-3-59029, and JP-B-3-37758 (the term "JP-B" as used herein means an "examined published Japanese patent application"), and these insulating materials are practically used.

Such insulating materials of the related arts are obtained by calcining mixtures of glass components and fillers at a low temperature and they have an advantage that the dielectric constant can be lowered as compared with alumina and the like. For example, when inexpensive $SiO_2$ is used as the filler and a crystal of quarts, cristobalite or the like is incorporated in the sintered material, not only a cost down but also lowering of the dielectric constant can be realized. This is because the dielectric constant of these crystals is low as 5 or lower. Also, the thermal expansion coefficient of crystals of quarts, cristobalite or the like is large. Accordingly, by adjusting the amount of the filler, the thermal expansion coefficient of the sintered body can be controlled. For example, when the insulating substrate composed of such a sintered material is mounted on an external electric circuit substrate such as a PC board, etc., it becomes very profitable dissolving mismatching, etc., of the thermal expansion coefficient of both the substrates.

However, the thermal expansion curve of the sintered body containing crystals of quarts, cristobalite or the like has a variation point of rapidly increasing the thermal expansion coefficient at a temperature specific to each crystal. Accordingly, at the time of decreasing the temperature after firing, crack tends to occur in the sintered body. Also, when such a sintered body is used as an insulating substrate for various wiring substrates, abrupt thermal expansion occurs by the temperature change at the use and as the result, there are problems that inferior contact of circuits occurs and at mounting the insulating substrate on an external electric circuit substrate, etc., inferior connection, etc., occurs.

SUMMARY OF THE INVENTION

Accordingly, an object of the present invention is to provide a low-temperature calcined ceramic comprising a sintered body containing an $SiO_2$ filler such as quartz or cristobalite, wherein the low-temperature calcined ceramic has characteristics that thermal expansion characteristics of abrupt change of the thermal expansion in a specific temperature range are vanished.

Other object of the present invention is to provide a wiring boad using the above-described low-temperature calcined ceramic as an insulating substrate.

Also, still other object of the present invention is to provide a mounted structure of a package for accommodating semiconductor using the above-described wiring boad.

That is, according to the present invention, there is provided a low-temperature calcined ceramic comprising a sintered body obtained by calcining a mixture of a glass and an $SiO_2$ filler, wherein the sintered body contains an $SiO_2$ crystal having an X-ray diffraction image that the peak at the (101) plane of quartz or cristobalite is at least 0.05° (2θ) shifted to the lower angle side.

Also, according to the present invention, there is provided a wiring boad comprising an insulating substrate having a metallized wiring layer disposed on the surface or in the inside thereof, wherein the insulating substrate is formed by the above-described low-temperature calcined ceramic.

Furthermore, according to the present invention, there is provided a mounted structure of package for accommodating a semiconductor having a wiring boad comprising an insulating substrate having a metallized wiring layer disposed on the surface or in the inside thereof, the package being connected to an external electric circuit boad via a connecting terminal, wherein the insulating substrate is formed by the low-temperature calcined ceramic.

DETAILED DESCRIPTION OF THE INVENTION

The present invention is described in detail below.

A particularly important feature of the low-temperature calcined ceramic of the present invention resides in the point that the $SiO_2$ crystal, wherein the spacing of the specific lattice plane of quartz or cristobalite is shifted, exists. That is, the $SiO_2$ crystal has a crystal structure of quartz or cristobalite but the X-ray diffraction peak of the (101) plane is shifted 0.05° (2θ) or more to the lower angle side as compared with that of regular quartz or cristobalite. According to the present invention, by partially changing the crystal structure of quartz or cristobalite as described above, the abrupt change of the thermal expansion specific to quartz or cristobalite can be restrained.

Figure 1:
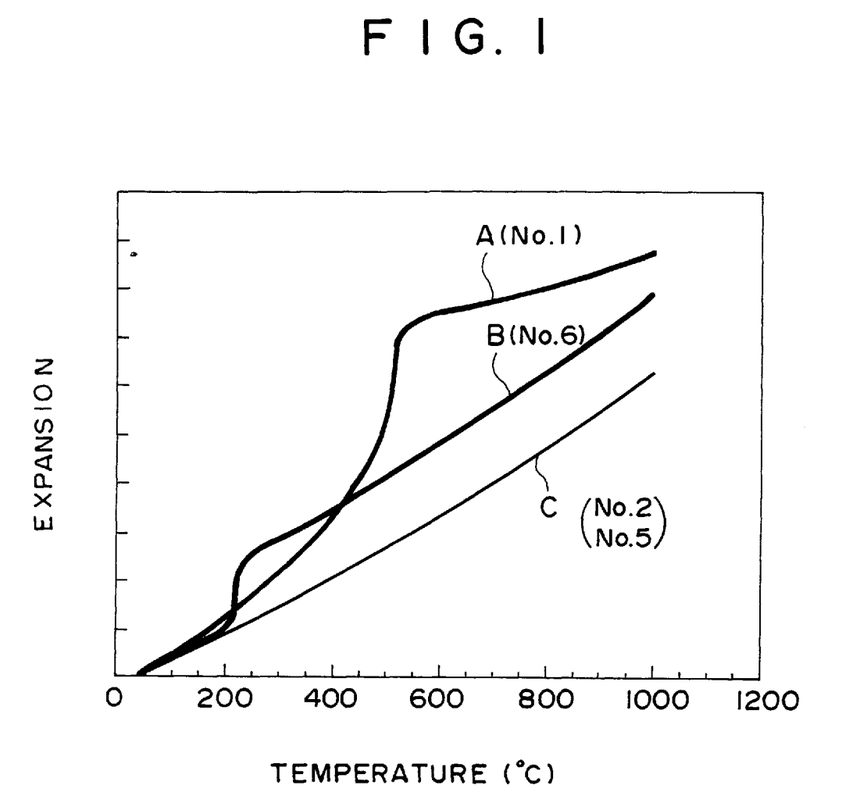
FIG. 1 is a graph showing thermal expansion curves of the low-temperature calcined ceramic (Sample No. 2, 5 of Example 1) of the present invention and a conventionally known low-temperature calcined ceramic (Sample No. 1, 6 of Example 1)

Now, referring to FIG. 1, curve A in FIG. 1 shows a thermal expansion curve of the sintered body (Sample No. 1 of Example 1 shown below) containing quartz [(101) plane peak, 2θ=26.65°] as the crystal. It can be seen that the curve A has a variation point between 400° C. and 600° C. and the coefficient of thermal expansion changes rapidly in the temperature range. Curve B shows a thermal expansion curve of the sintered body (sample No. 6 of Example 1) containing cristobalite [(101) plane peak, 2θ=21.93°] as the crystal. This curve B has a variation point between 200° C. and 250° C.

On the other hand, curve C in FIG. 1 is an embodiment of the present invention and shows a thermal expansion curve of the sintered body (Sample No. 2 or 5 of Example 1) having a crystal structure that the (101) plane peak of quartz or cristobalite is 0.20° or 0.23° (2θ) shifted to the lower angle side. As shown in the curve C, it can be seen that the thermal expansion curve of the sintered body of the present invention is substantially a straight line, does not have a variation point as shown in the curve A, B described above, and does not have a region in which the coefficient of thermal expansion abruptly changes.

As described above, the sintered body of the present invention having the $SiO_2$ crystal of the structure that the X-ray diffraction peak of the (101) plane of quartz or cristobalite is 0.05° (2θ) or more shifted to the lower angle side does not have a region in which the coefficient of thermal expansion abruptly changes, specific to quartz or cristobalite, and thus when the sintered material is used as an insulating substrate in a wiring boad, the occurrence of inferior contact of a circuit by a temperature change and inferior connection, etc., at mounting with an external electric circuit boad can be effectively prevented.

In the present invention, the extent (the degree of the shift to the lower angle side) of the shift of the (101) plane peak of the above-described $SiO_2$ crystal is 0.05° degree (2θ) or more and there is no particular restriction on the upper limit of the shifting extent if the fundamental crystal structure of quartz or cristobalite is maintained but usually the upper limit is preferably 0.5° (2θ).

Also, it is particularly profitable in the points of decreasing the dielectric constant and increasing the coefficient of thermal expansion that the ratio of the above-described $SiO_2$ crystal present in the sintered material is in the range of from 5 to 75% by volume.

In addition, in the present invention, to form the $SiO_2$ crystal in which a part of the crystal structure of quartz or cristobalite is shifted in the sintered body, it is necessary to use a crystalline inorganic powder containing an alkaline earth metal oxide component as a filler and make the component exist in the crystal of quartz or cristobalite as a solid solution as described below in detail.

(Glass component)

As the glass component used for the production of the low-temperature calcined ceramic of the present invention, a conventionally known glass such as a zinc borosilicate glass, a lead borosilicate glass, etc., can be used. However, in the point of increasing the thermal expansion of the sintered body, a glass having a thermal expansion coefficient of from 6 to 18 ppm/° C. at a temperature of from 40° to 400° C., such as, a lithium silicate glass, a PbO glass, a BaO glass, or a ZnO glass is preferably used. In addition, the above-described thermal expansion coefficient of the glass component means, in case of a crystallized glass, the coefficient of thermal expansion after heat treatment at a calcination temperature and means the coefficient of linear expansion. Also, to efficiently remove an organic binder used for the molding and increase the simultaneous sintering property with a metal such as copper, etc., it is preferred that the yield point of the glass used is controlled to a range of from 400° to 800° C., and particularly from 400° to 650° C.

As the lithium silicate glass, the glass containing $Li_2O$ in a ratio of from 5 to 30% by weight, and particularly from 5 to 20% by weight is preferred and when the lithium silicate glass is used, lithium silicate having a high coefficient of thermal expansion can be deposited after calcination. Also, the above-described lithium silicate glass contains $SiO_2$ as an indispensable component in addition to $Li_2O$ and it is preferred for depositing the lithium silicate crystal that $SiO_2$ exists in a ratio of from 60 to 85% by weight of the total glass amount and the sum total of $SiO_2$ and $Li_2O$ is from 65 to 95% by weight of the total glass amount. Also, the lithium silicate glass may further contain $Al_2O_3$, MgO, $TiO_2$, $B_2O_3$, $Na_2O$, $K_2O$, $P_2O_5$, ZnO, F, etc., in addition to the above-described components. In this case, however, it is preferred that the content of $B_2O_3$ is not more than 1% by weight.

The PbO glass is a glass powder containing PbO as a principal component together with at least one of $B_2O_3$ and $SiO_2$ and in particular, a glass powder in which a crystal phase with a high thermal expansion, such as $PbSiO_3$, $PbZnSiO_4$, etc., is deposited is preferably used. In particular, a crystalline glass having a composition of PbO (65 to 85% by weight)-$B_2O_3$ (5 to 15% by weight)-ZnO (6 to 20% by weight)-$SiO_2$ (0.5 to 5% by weight)-BaO (0 to 5% by weight) and a crystalline glass having a composition of PbO (50 to 60% by weight)-$SiO_2$ (35 to 50% by weight)-$Al_2O_3$ (1 to 9% by weight) are preferable.

The ZnO glass contains Zno in a ratio of 10% by weight or more and can further contain at least one of $SiO_2$ (60% by weight or less), $Al_2O_3$ (60% by weight or less), $B_2O_3$ (30% by weight or less), $P_2O_5$ (50% by weight or less), an alkaline earth metal oxide (20% by weight or less), $Bi_2O_3$ (30% by weight or less), etc., in addition to ZnO. In particular, the ZnO glass capable of depositing a crystal phase having a high coefficient of thermal expansion, such as $ZnO.Al_2O_3.SiO_2.nB_2O_3$, etc., by calcination is suitable. For example, a crystalline glass having a composition of ZnO (10 to 50% by weight)-$Al_2O_3$ (10 to 30% by weight)-$SiO_2$ (30 to 60% by weight) and a crystalline glass having a composition of ZnO (10 to 50% by weight)-$SiO_2$ (5 to 40% by weight)-$Al_2O_3$ (0 to 15% by weight)-BaO (0 to 60% by weight)-MgO (0 to 35% by weight) are suitable.

The BaO glass contains BaO in a ratio of 10% by weight or more and may further contain $Al_2O_3$, $SiO_2$, $B_2O_3$, $P_2O_5$, an alkaline earth metal oxide, an alkali metal oxide, etc., in addition to the above-described component. In particular, the BaO glass capable of depositing a crystal phase such as $BaAl_2Si_2O_3$, $BaSi_2O_3$, $BaB_2Si_2O_3$, etc., is suitable.

(Filler)

In the present invention, the use of an $SiO_2$ filler such as quarts or cristobalite is indispensable and quarts and cristobalite can be used together. Such a $SiO_2$ filler is used in an amount that the ratio of the $SiO_2$ crystal present in the sintered material is in the above-described range (i.e., from 5 to 75% by volume per sintered body).

Also, in the present invention, to cause the crystal displacement (shift) of quartz or cristobalite in the sintered body, a ceramic filler made up of a crystalline inorganic powder containing an alkaline earth metal oxide component such as MgO, CaO, SrO, BaO, etc., is used in combination with the above-described $SiO_2$ filler.

Examples of such a ceramic filler include magnesia (MgO), forsterite ($2MgO.SiO_2$), spinel ($MgO.Al_2O_3$), wollastonite ($CaO.SiO_2$), monticellanite ($CaO.MgO.SiO_2$), diopside ($CaO.MgO.2SiO_2$), merbinite ($2CaO.MgO.2SiO_2$), akermite ($2CaO.MgO.2SiO_2$), enstatite ($MgO.SiO_2$), magnesium borate ($2MgO.B_2O_3$), celsian ($BaO.Al_2O_3.2SiO_2$), and $B_2O_3.2MgO.2SiO_2$. In these ceramic fillers, the MgO-containing fillers are preferred and the most suitable ceramic fillers are magnesia, forsterite, and enstatite.

That is, in the present invention, by forming a solid solution of quartz or cristobalite and the alkaline earth metal oxide component contained in the above-described filler, the above-described displacement (shift) of the crystal can be caused. There is no particular restriction on the amount of the ceramic filler containing an alkaline earth metal oxide if the crystal displacement (shift) of quartz or cristobalite is effectively caused but, in general, it is preferred to use the ceramic filler in an amount of not smaller than 1 parts by weight in terms of the alkaline earth metal oxide per 100 parts by weight of the $SiO_2$ filler. Also, because the coefficient of thermal expansion of the ceramic filler at a temperature of from 40° to 400° C. is 6 ppm/° C. or higher, it is preferred that the amount of the ceramic filler used is properly controlled such that the coefficient of thermal expansion of the sintered body obtained is in the range of from 8 to 18 ppm/° C. at a temperature of from 40° to 400° C. That is, when the thermal expansion coefficient of the sintered body is in the range, in case of using the sintered body as an insulating substrate for a wiring boad, the occurrence of miss matching at mounting the wiring boad on an external electric circuit boad (mother boad) can be effectively prevented.

In addition, the alkaline earth metal oxide component described above is sometimes contained in the glass component but the alkaline earth metal oxide component contained in the glass component does not contribute to the above-described displacement (shift) of the crystal (see the experimental result of Sample No. 9 in Example 1 described later). The reason has not yet been clarified but it is considered that the alkaline earth metal oxide in the glass component may exist in a state of being hard to react with quarts or cristobalite.

In the present invention, when forsterite or enstatite is used as the ceramic filler containing an alkaline earth metal oxide, the tenacity and strength of the sintered body can be remarkably increased.

Ordinary ceramics have disadvantages that the tenacity is low and brittle fracture is liable to occur. That is, it is known that in an ordinary ceramic, when a crack occurs in a microscopically very fine defect portion, the crack quickly spreads in the ceramic to fracture the ceramic.

However, when enstatite is used as the ceramic filler, by a solid solution forming treatment described later, an enstatite crystal grown into a needle form or a columnar form is formed. Also, when forsterite is used as the ceramic filler, crystal modification occurs by a solid solution forming treatment and an enstatite crystal grown into a needle form or a columnar form is also formed. In the sintered body containing the enstatite crystal grown into the needle form or the columnar form, even when a crack is formed in a fine defect portion, spreading of the crack is restrained, whereby the occurrence of the brittle fracture is effectively prevented. Accordingly, the sintered body of the present invention obtained by using forsterite or enstatite is particularly excellent in the tenacity and strength. In this case, to greatly improve the tenacity and strength, a mean aspect ratio of the enstatite crystal is in a range of preferably at least 3, more preferably at least 4, and most preferably from 4.5 to 5.5 and the content of the enstatite crystal in the sintered body is preferably in a range of from 10 to 60% by weight.

In the present invention, the total amount of the above-described various fillers is in a range of preferably from 10 to 90% by volume (the rest being the glass component), and particularly preferably from 20 to 80% by volume but provided that the total amount of the fillers is in the above-described range, other filler(s) than the $SiO_2$ filler or the ceramic filler described above can be used. As such other fillers, a crystalline inorganic powder such as, for example, tridymite can be used and further still other ceramic fillers such as $ZrO_2$, petalite ($LiAlSi_4O_{10}$), nepheline ($Na_2O.Al_2O_3.SiO_2$), lithium silicate ($Li_2O.SiO_2$), carnegieite ($Na_2O.Al_2O_3.2SiO_2$), gahnite ($ZnO.Al_2O_3$), $CaTiO_3$, $BaTiO_3$, $SrTiO_3$, $TiO_2$, etc., can be also used. Because the coefficients of thermal expansion of the ceramic fillers illustrated above are also 6 ppm/° C. or higher at a temperature of from 40° to 400° C. as those of the ceramic fillers illustrated previously, these ceramic fillers are advantageously used in the point of setting up the coefficient of thermal expansion of the sintered body obtained in a range of from 8 to 18 ppm/° C. at a temperature of from 40° to 400° C.

(Production of Low-temperature Calcined Ceramics)

As the production of the low-temperature calcined ceramic of the present invention, first, a proper organic binder is added to the mixture of the glass component and the filler component described above and the resultant mixture is molded into a desired form. The glass component and the filler component are usually used as the forms of powders each having an average particle size of not larger than 10 μm. As the molding means, a known method such as die press, cold static hydraulic press, injection molding, extrusion molding, doctor blade method, calender roll method, rolling method, etc., can be used.

Then, the organic binder is removed from the molding product obtained. The removal of the organic binder is usually carried out in air or a nitrogen gas atmosphere at a temperature of about 700° C. Also, in case of carrying out calcination simultaneously with Cu as a wiring conductor (metallizing paste), it is preferred to remove the binder in a nitrogen gas atmosphere of a temperature of from 100° to 700° C. containing a steam. Also, to effectively carry out the removal of the binder, it is desirable that the shrinking initiation temperature of the molding product is from about 700° to 850° C. To control the shrinking initiation temperature of the molding product to the above-described temperature range, it is preferred to use a glass having a yield point of the above-described temperature range (i.e., from 400° to 800° C., in particular from 400° to 650° C).

After removing the organic binder from the molding product, calcination is carried out but in the present invention, to cause the crystal displacement (shift) of quartz or cristobalite, a solid solution formation treatment by using an alkaline earth metal oxide is carried out prior to calcination or when heating the molding product to the calcining temperature. The solid solution formation treatment is carried out by keeping the above-described molding product at a temperature, practically a temperature of from 830° to 900° C. at which the alkaline earth metal oxide such as MgO, etc., forms a solid solution for a definite time (from about 0.5 to 5 hours). Also, in the case of using forsterite or enstatite as the filler containing an alkaline earth metal oxide, to sufficiently form the needle form or columnar form of the enstatite crystal, it is preferred that the treatment time is 0.5 hours or longer.

Calcination of the molding product is carried out in an oxidative atmosphere or non-oxidative atmosphere at a temperature of 850° C. or higher, whereby the sintered body compacted to a relative density of at least 90% can be obtained. Also, in case of preparing a wiring boad by simultaneously calcining a metallized wiring layer of Cu, Ag, etc., it is necessary that the calcination is carried out in the non-oxidative atmosphere and the calcination temperature of 1050° C. or lower. This is because if the calcination temperature is higher than 1050° C., the metallized wiring layer to be formed is melted.

In the sintered body of the present invention thus prepared, the $SiO_2$ crystal having a crystal structure that the (101) plane peak of quartz or cristobalite is shifted is formed and in the thermal expansion curve of the sintered body, the variation point of abruptly changing the thermal expansion, specific to quarts or cristobalite, is vanished. For example, when in regard to the thermal expansion curve, the change ratio of the thermal expansion is calculated according to the following equation (1) in a temperature range of from 0° C. to 1,000° C., the change ratio becomes 1 ppm/° C. or lower and thus, it can be seen that the variation point of abruptly changing the thermal expansion does not exist.

Thermal expansion changed ratio=

$$|TCE(t\sim t+50)-TCE(t+50\sim t+100)| \quad (1)$$

wherein $TCE(t\sim t+50)$ is a coefficient of thermal expansion at the range of t° C. to t+50° C. and $TCE(t+50\sim t+100)$ is a coefficient of thermal expansion at the range of t+50° C. to t+100° C.

Also, in the sintered body of the present invention, a crystal phase formed from the glass component, a crystal phase formed by the reaction of the glass component and the filler component, a crystal phase formed by the decomposition of the filler component, etc., may exist in addition to the above-described $SiO_2$ crystal, and in the grain boundary of these crystal phases, a glass phase sometimes exists.

It is desirable that the dielectric constant of the sintered body of the present invention is 6 or lower and further it is preferred that the coefficient of thermal expansion of the sintered body at a temperature of from 40° to 400° C. is from 8 to 18 ppm/° C. Such a sintered body is useful as an insulating substrate used as a wiring boad, and because the sintered body can be calcined at a low temperature, by forming a metallized wiring layer composed of a low-melting metal such as Cu, Ag, etc., by simultaneous calcination, a wiring boad can be prepared. Also, when such a wiring boad is mounted on an external electric circuit boad such as a PC board as a package containing a semiconductor element, etc., the sintered body does not cause abrupt thermal expansion by heating at mounting, whereby the occurrence of inferior connection can be effectively prevented. Also, because the occurrence of a thermal stress caused by the difference in thermal expansion between the wiring boad and the external electric circuit boad is effectively restrained, a stable electric contact state can be maintained for a long period of time.

In the sintered body of the present invention, the sintered body containing an enstatite crystal having an average aspect ratio of at least 3 is particularly excellent in the points of the tenacity and strength.

(Mounted structure)

Figure 2:
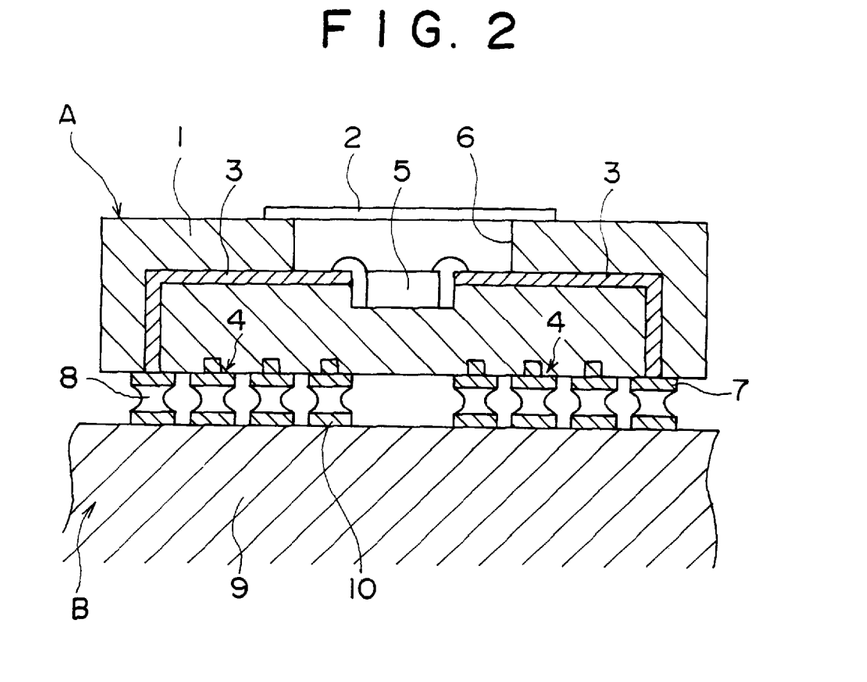
FIG. 2 is a cross-sectional view showing a mounted structure of a ball grid array (BGA)-type package for accomodating a semiconductor element in the present invention.

FIG. 2 is an enlarged schematic view showing an embodiment of a mounted structure of a package for accommodating semiconductor elements equipped with a low-temperature calcined ceramic as an insulating substrate, and an embodiment of a ball grid array (BGA) type package. In the figure, A is a package for accommodating semiconductor elements and B is an external electric circuit boad (mother boad).

In FIG. 2, the package A for accommodating a semiconductor element is equipped with an insulating substrate 1 formed by the low-temperature calcined ceramic of the present invention described above, a lid 2, a metallized wiring layer 3, and connecting terminals 4, and a cavity 6 is formed on the upper surface of the insulating substrate 1. A semiconductor element 5 is placed in the cavity 6 and fixed to the insulating substrate 1 with an adhesive, and the inside of the cavity 6 is air-tightly maintained by the lid 2.

The metallized wiring layer 3 formed on the insulating substrate 1 is connected to the semiconductor element 5 by wire bonding, etc., and also connected to many connecting terminals 4 formed on the lower surface of the insulating substrate 1.

Each of the connecting terminals 4 is equipped with an electrode pad 7 and the electrode pad 7 is equipped with a projecting terminal 8 made up of a soldering material such as a soft solder (tin-lead alloy).

On the other hand, the external electric circuit boad B is a general printed boad and has an insulator 9 made up of a composite material, etc., containing an organic resin, such as a glass-epoxy resin composite material, and wiring layers 10 are fixed on the surface of the insulator 9. The wiring layers 10 are made of a metal or an alloy, such as Cu, Au, Al, Ni, Pb-Sn, etc.

Mounting of the package A for accommodating a semiconductor element on the external electric circuit boad B is carried out by placing in contact each of the projecting terminal 8 of the connecting terminal 4 of the package A on each wiring layer 10 of the external electric circuit boad B and thereafter heating them to a temperature of from about 250° to 400° C., whereby the projecting terminals 8 themselves made of a soldering material such as a soft solder, etc., are melted and electrode pads 7 are connected to the wiring layers 10. Accordingly, to carry out the connection surely, it is desirable that a soldering material is attached to the surface of each wiring layer 10 of the external electric circuit boad B.

In such a mounted structure, the insulating substrate 1 of the package A is formed with the above-described low-temperature calcined ceramic, the difference in the coefficient of thermal expansion between the insulating substrate 1 and the insulator 9 of the external electric circuit boad B is small, and the insulating substrate 1 does not have the temperature range of greatly changing the thermal expansion. Accordingly, the occurrence of miss matching of the package A and the external electric circuit boad B at mounting is effectively restrained and the occurrence of inferior connection is effectively prevented. Also, when the ambient temperature is changed, the snapping of wires of the circuits does not occur and a stable electric connection state having high reliability is maintained for a long period of time.

Figure 3:
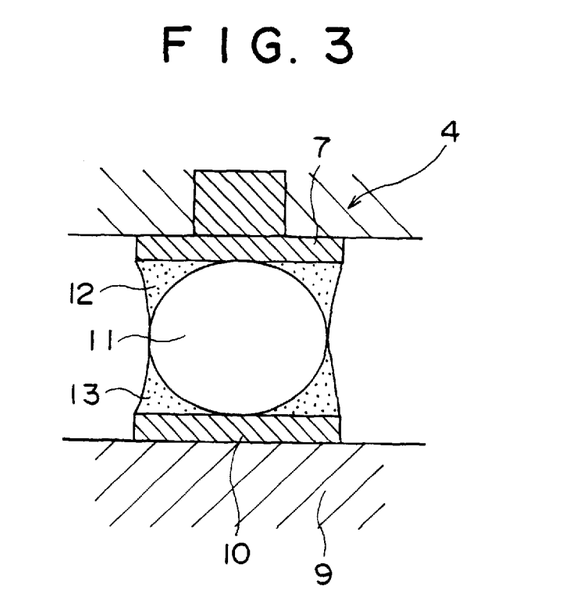
FIG. 3 is an enlarged cross-sectional view of a major portion showing other embodiment of a connecting terminal used for the package shown in FIG. 2.

FIG. 3 is a partially enlarged cross-sectional view showing other embodiment of the connecting terminal 4 of the package A. In this embodiment, to the electrode pad 7 of the connecting terminal 4 is soldered a spherical terminal 11 with a low-melting soldering material 12. In this case, the spherical terminal 11 is formed by a material having a higher melting point than that of the low-melting soldering material 12. For example, when as the low-melting soldering material 12, a low-melting soft solder having a composition of 40% by weight Pb and 60% by weight Sn, the spherical terminal 11 is formed by a high-melting soft solder having a composition of 90% by weight Pb and 10% by weight Sn or a metal such as Cu, Ag, Ni, Al, Au, Pt, Fe, etc.

Mounting using the connecting terminal 4 having such structure is carried out by placing in contact the spherical terminal 11 fixed to the electrode pad 7 of the package A on the wiring layer 10 of the external electric circuit boad A and heating them to connect the spherical terminal 11 to the wiring layer 10 with a soldering material 13. In this case, the form of the spherical terminal 11 can be formed into a columnar form. Also, there is no particular restriction on the material of the soldering material 12 or the soldering material 13, and for example, an Au-Sn alloy can be used.

EXAMPLE 1

A glass powder was mixed with a filler, and after further grinding the mixture, an organic binder was added to the ground mixture, followed by mixing sufficiently. The mixture obtained was molded by a uniaxial press method into a molding product having a form of 3.5 mm×15 mm. The kinds of the glass and the filler and the mixing ratio of them are shown in Tables 1 and 2 below.

Each of the molding products was subjected to a binder-removing treatment in an atmosphere of $N_2$ and $H_2O$ at a temperature of 700° C. and after maintaining at 880° C. for 1 hour, the molding product was calcined in air for 1 hour at the temperature shown in Tables 1 and 2 below.

About the sintered body obtained, the following analysis and the evaluations of the characteristics were carried out and the results are shown in Tables 1 and 2.

Identification of Crystal Phase:

For each sintered body obtained, X-ray diffraction measurement was carried out using Cu as a target and the identification of a crystal phase was carried out. Also, a shift width (degree) of the peak of the (101) plane was measured from an X-ray chart. As the standard of the shift width, the (101) plane of quartz was defined as $2\theta=26.64°$ and the (101) plane of cristobalite was defined as $2\theta=21.930$.

Thermal Expansion Characteristics:

The coefficient of thermal expansion of each sintered material at a temperature of from 40° to 400° C. was measured and also the presence or absence of the variation point in the thermal expansion curve at 0° C. to 1000° C. was confirmed. (when the thermal expansion curve has a portion in which the value of the formula (1) above-mentioned exceeds to 1 ppm/° C., it is considered that the curve has the variation point.)

Dielectric Constant Characteristics:

Each sintered body was formed into a form having a diameter of 60 mm and a thickness of 2 mm and the dielectric constant thereof was determined by the method of JIS-C-2141. The measurement was carried out using an LCR meter (Y.H. P4284A), an electrostatic capacity at 25° C. was measured under the conditions of 1 MHz and 1.0 Vrsm and from the electrostatic capacity, the dielectric constant at 25° C. was determined.

Heat Cycle Characteristics at Mounting:

Using the mixture of a glass powder and a filler as in the case of preparing each of the sintered bodies described above, each green sheet of 250 μm in thickness was prepared by a doctor blade method and a Cu metallizing paste was coated on the surface of the sheet by a screen printing method. Also, throughholes were formed at definite portions of each green sheet and the Cu metallizing paste was filled in the holes. Then, the 6 green sheets coated with a metallizing paste were laminated while matching the positions of the through holes and press-stuck.

The laminate was subjected to a binder-removing treatment in an atmosphere of $N_2$ and $H_2O$ at 700° C., and after maintaining the laminate at 880° C. for 1 hour as described above, the laminate was calcined under the same conditions as above to prepare a wiring boad having the simultaneously calcined metallized wiring layer and laminate.

By fixing each spherical soft solder ball made of 90% by weight Pb and 10% by weight Sn to each electrode pad formed on the lower surface of the wiring boad obtained using a low-melting soft solder (Pb 37%-Sn 63%) to form each connecting terminal. The connecting terminals were formed on the whole of the lower surface of the wiring board at a density of 60 terminals per cm².

The wiring board was mounted on the surface of a printed board having a wiring conductor made of a copper foil on the surface of an insulating substrate (the coefficient of thermal expansion at a temperature of from 40° to 800° C.:13 ppm/° C.) made of a glass-epoxy resin composite material to provide a test sample. In this case, mounting was carried out by position-matching the wiring conductor on the printed board and the spherical terminals of the wiring board and connecting them to each other with a low-melting soft solder.

The test sample was alternately placed in a constant temperature bath of −40° C. and a constant temperature bath of 125° C. for 15 minutes each in an atmosphere of air, the maintenance of 15 minutes/15 minutes was defined 1 cycle, and the above operation was repeated 1,000 cycles. After carrying out the thermal history of 1,000 cycles as described above, the electric resistance between the wiring conductor of the printed board and the wiring board for package was measured and the sample having no difference between the electric resistance before the initiation of the thermal history was evaluated as "OK" and the sample having a large difference was evaluated as "NG".

TABLE 1

| Sample No. | Number before the chemical formula is wt. % | Glass component characteristics Thermal expansion coefficient (ppm/°C.) | Rest; glass component | Filler component (Vol %) | Calcination temp. (°C.) | Thermal expansion coefficient (ppm/°C.) | (101) plane shift (2 Θ:°) | Presence of variation point | Dielectric constant | Heat cycle test 1000 cycles | Crystal phase |
|---|---|---|---|---|---|---|---|---|---|---|---|
| *1 | 74SiO$_2$—14Li$_2$O—4Al$_2$O$_3$—2P$_2$O$_5$—2K$_2$O—2ZnO—2Na$_2$O | 10 | Q | 60 | 920 | 20.5 | 0 | found | 4.8 | NG | LS, Q |
| 2 | 74SiO$_2$—14Li$_2$O—4Al$_2$O$_3$—2P$_2$O$_5$—2K$_2$O—2ZnO—2Na$_2$O | 10 | Q F | 35 25 | 920 | 12.5 | −0.20 | none | 5.4 | OK | LS, Q, E |
| 3 | 74SiO$_2$—14Li$_2$O—4Al$_2$O$_3$—2P$_2$O$_5$—2K$_2$O—2ZnO—2Na$_2$O | 10 | Q M | 35 25 | 920 | 12.4 | −0.23 | none | 5.3 | OK | LS, Q, E |
| *4 | 74SiO$_2$—14Li$_2$O—4Al$_2$O$_3$—2P$_2$O$_5$—2K$_2$O—2ZnO—2Na$_2$O | 10 | Q P | 35 25 | 920 | 11.3 | 0 | found | 5.5 | NG | LS, Q, E, P |
| 5 | 74SiO$_2$—14Li$_2$O—4Al$_2$O$_3$—2P$_2$O$_5$—2K$_2$O—2ZnO—2Na$_2$O | 10 | C M | 35 25 | 920 | 12.6 | −0.23 | none | 5.4 | OK | LS, C, E |
| *6 | 74SiO$_2$—14Li$_2$O—4Al$_2$O$_3$—2P$_2$O$_5$—2K$_2$O—2ZnO—2Na$_2$O | 10 | C | 60 | 920 | 21.0 | 0 | found | 4.9 | NG | LS, C |
| *7 | 78SiO$_2$—15B$_2$O$_3$—5Na$_2$O—2Al$_2$O$_3$ | 5 | Q | 25 | 1000 | 33.0 | 0 | found | 4.6 | NG | Q |
| 8 | 78SiO$_2$—15B$_2$O$_3$—5Na$_2$O—2Al$_2$O$_3$ | 5 | Q F | 20 5 | 1000 | 13.3 | −0.07 | none | 4.9 | OK | Q, E, C |
| *9 | 45SiO$_2$—28Al$_2$O$_3$—10B$_2$O$_3$—10MgO—7ZnO | 6 | C | 25 | 1000 | 26.0 | 0 | found | 4.2 | NG | C |
| 10 | 45SiO$_2$—28Al$_2$O$_3$—10B$_2$O$_3$—10MgO—7ZnO | 6 | C M | 25 5 | 1000 | 14.0 | −0.08 | none | 4.5 | OK | C, Q, E |
| 11 | 45SiO$_2$—28Al$_2$O$_3$—10B$_2$O$_3$—10MgO—7ZnO | 6 | Q F | 20 5 | 1000 | 14.2 | −0.08 | none | 4.5 | OK | C, Q, E |

Q: Quartz,
F: Forsterite,
M: Magnesia;
P: Petalite,
C: Cristobalite,
LS: Lithium silicate,
E: Enstatite,

TABLE 2

| Sample No. | Number before the chemical formula is wt. % | Glass component characteristics Thermal expansion coefficient (ppm/°C.) | Rest; glass component | Filler component (Vol %) | Calcination temp. (°C.) | Thermal expansion coefficient (ppm/°C.) | (101) plane shift (2 Θ:°) | Presence of variation point | Dielectric constant | Heat cycle test 1000 cycles | Crystal phase |
|---|---|---|---|---|---|---|---|---|---|---|---|
| *12 | 15BaO—25ZnO—45P$_2$O$_5$—10Al$_2$O$_3$—5SiO$_2$ | 10 | Q | 60 | 940 | 18.2 | 0 | found | 5.1 | NG | Q, G |
| 13 | 15BaO—25ZnO—45P$_2$O$_5$—10Al$_2$O$_3$—5SiO$_2$ | 10 | Q F | 35 25 | 940 | 11.3 | −0.24 | none | 5.2 | OK | Q, E, G |
| 14 | 15BaO—25ZnO—45P$_2$O$_5$—10Al$_2$O$_3$—5SiO$_2$ | 10 | C M | 35 25 | 940 | 11.5 | −0.22 | none | 5.2 | OK | Q, E, G |
| *15 | 75PbO—9B$_2$O$_3$—12ZnO—2SiO$_2$—2BaO | 11 | Q | 60 | 910 | 19.3 | 0 | found | 4.8 | NG | Q |
| 16 | 75PbO—9B$_2$O$_3$—12ZnO—2SiO$_2$—2BaO | 11 | Q F | 35 25 | 910 | 11.6 | −0.28 | none | 5.2 | OK | Q, E |
| *17 | 38ZnO—15Al$_2$O$_3$—45SiO$_2$—2B$_2$O$_3$ | 11 | C | 60 | 910 | 19.0 | 0 | found | 5.2 | NG | C, G |

TABLE 2-continued

| Sample No. | Number before the chemical formula is wt. % | Glass component characteristics Thermal expansion coefficient (ppm/°C.) | Rest; glass component | Filler component | Filler component (Vol %) | Calcination temp. (°C.) | Thermal expansion coefficient (ppm/°C.) | (101) plane shift (2Θ:°) | Presence of variation point | Dielectric constant | Heat cycle test 1000 cycles | Crystal phase |
|---|---|---|---|---|---|---|---|---|---|---|---|---|
| 18 | 38ZnO—15Al$_2$O$_3$—45SiO$_2$—2B$_2$O$_3$ | 11 | Q<br>F | 35<br>25 | | 910 | 11.5 | -0.18 | none | 5.6 | OK | Q, E, G |
| 19 | 38ZnO—15Al$_2$O$_3$—45SiO$_2$—2B$_2$O$_3$ | 11 | C<br>M | 35<br>25 | | 910 | 11.7 | -0.16 | none | 5.6 | OK | Q, E, G |

Q: Quartz,
F: Forsterite,
M: Magnesia;
C: Cristobalite,
G: Gahnite,
E: Enstatite, As is clear from Tables 1 and 2, in the sample Nos. 1, 4, 6, 7, 9, 12, 15, and 17 which did not use the filler containing MgO, the variation point existed in the thermal expansion curves and these samples were inferior in durability in the heat cycle test.

On the other hand, in the samples of the present invention using the filler containing MgO together with the SiO$_2$ filler, the shift of 0.05° or more was confirmed at the (101) plane of quartz or cristobalite crystal, the variation point did not exist in the thermal expansion curves, and the samples showed excellent characteristics in the heat cycle test.

EXAMPLE 2

This Example shows the results of the experiment carried out for confirming particularly the effect of an enstatite crystal in the sintered body giving the tenacity and strength.

Using each glass having the composition shown in Table 3 below and each of the fillers shown in Tables 4 and 5 below, by following the same procedures as in Example 1, each of the moldings having a form of 3.5 mm×15 mm was prepared. The molding was subjected to a binder-removing treatment and after applying a proper solid solution forming treatment, the molding product was calcined to prepare a sintered body. The conditions (temperature×time) for the solid solution forming treatment and the calcination conditions were shown in Tables 4 and 5.

The surface of the sintered material was mirror-plane-polished, the average aspect ratio (long diameter/short diameter) of the enstatite crystal was determined by the observation of a polarization microscope and also evaluations of various characteristics were carried out as in Example 1. The results were shown in Tables 4 and 5 together.

TABLE 3

| Kind of glass | Composition The inside of ( ) is wt. % | Thermal expansion coefficient (ppm/°C.) |
|---|---|---|
| 1 | SiO$_2$(74)-Li$_2$O(14)-Al$_2$O$_3$(4)-P$_2$O$_5$(2)-K$_2$O(2)-ZnO(2)-Na$_2$O(2) | 10 |
| 2 | SiO$_2$(78)-B$_2$O$_3$(15)-Na$_2$O(5)-Al$_2$O$_3$(2) | 5 |
| 3 | SiO$_2$(45)-Al$_2$O$_3$(28)-B$_2$O$_3$(10)-MgO(10)-ZnO(7) | 6 |
| 4 | BaO(15)-ZnO(25)-P$_2$O$_5$(45)-Al$_2$O$_3$(10)-SiO$_2$(5) | 10 |

TABLE 4

| No. | Kind of glass | Filler (vol. %), rest, glass Enstatite | Filler (vol. %), rest, glass Forsterite | Filler (vol. %), rest, glass Quartz | Calcination condition temp. (°C.) × time (hr) | Enstatite average aspect ratio | Strength (Mpa) | Toughness (Mpa · m$^{1/2}$) | Thermal expansion coefficient (ppm/°C.) | Dielectric constant | Heat cycle test |
|---|---|---|---|---|---|---|---|---|---|---|---|
| *1 | 1 | 60 | — | — | 930 × 1 | 1.5 | 180 | 1.4 | 11.1 | 5.5 | OK |
| 2 | 1 | 60 | — | — | 850 × 1 + 920 × 1 | 4.3 | 240 | 2.1 | 11.1 | 5.5 | OK |
| 3 | 1 | 3 | — | 57 | 850 × 1 + 920 × 1 | 4.3 | 180 | 1.4 | 13.2 | 4.9 | OK |
| 4 | 1 | 5 | — | 55 | 850 × 1 + 920 × 1 | 4.3 | 210 | 1.7 | 13.1 | 4.9 | OK |
| *5 | 1 | 5 | — | 55 | 930 × 1 | 1.5 | 170 | 1.3 | 13.1 | 4.9 | OK |
| 6 | 1 | 10 | — | 50 | 850 × 1 + 920 × 1 | 4.3 | 240 | 1.9 | 12.9 | 5.1 | OK |
| 7 | 1 | 40 | — | 20 | 850 × 1 + 920 × 1 | 4.3 | 250 | 2.1 | 11.3 | 5.2 | OK |
| 8 | 1 | 60 | — | 0 | 860 × 1 + 910 × 1 | 4.3 | 250 | 2.1 | 11.1 | 5.4 | OK |
| 9 | 1 | 70 | — | 0 | 860 × 1 + 910 × 1 | 5.5 | 270 | 2.3 | 11.2 | 5.4 | OK |
| 10 | 2 | — | 30 | 30 | 850 × 1 + 920 × 1 | 5.5 | 270 | 2.3 | 11.7 | 5.4 | OK |
| 11 | 2 | — | 40 | 30 | 860 × 1 + 920 × 1 | 5.7 | 290 | 2.4 | 11.8 | 5.5 | OK |
| *12 | 2 | 25 | 0 | — | 930 × 1 | 1.5 | 170 | 1.2 | 7 | 5.3 | NG |
| *13 | 2 | 25 | 30 | — | 850 × 1 + 920 × 1 | 4.2 | 240 | 1.9 | 7 | 5.3 | NG |
| 14 | 2 | 10 | 30 | 15 | 930 × 1 | 1.5 | 175 | 1.2 | 8.6 | 5.1 | OK |
| 15 | 2 | 10 | 30 | 15 | 850 × 1 + 920 × 1 | 3.6 | 220 | 1.8 | 8.6 | 5.1 | OK |
| 16 | 2 | 5 | 30 | 20 | 850 × 1 + 920 × 1 | 3.6 | 210 | 1.7 | 9.2 | 4.9 | OK |

Mark * shows the outside the scope of the invention.

TABLE 5

| No. | Kind of glass | Filler (vol. %), rest, glass Enstatite | Filler (vol. %), rest, glass Forsterite | Filler (vol. %), rest, glass Quartz | Calcination condition temp. (°C.) × time (hr) | Enstatite average aspect ratio | Strength (Mpa) | Toughness (Mpa · m$^{1/2}$) | Thermal expansion coefficient (ppm/°C.) | Dielectric constant | Heat cycle test |
|---|---|---|---|---|---|---|---|---|---|---|---|
| *17 | 3 | 25 | 30 | — | 930 × 1 | 1.5 | 170 | 1.2 | 7 | 4.9 | NG |
| 18 | 3 | 25 | 30 | — | 850 × 1 + 920 × 1 | 4.2 | 240 | 1.9 | 7 | 4.9 | NG |
| *19 | 3 | 10 | 30 | 15 | 930 × 1 | 1.5 | 175 | 1.2 | 8.6 | 4.7 | OK |
| 20 | 3 | 10 | 30 | 15 | 850 × 1 + 920 × 1 | 3.6 | 220 | 1.8 | 8.6 | 4.7 | OK |
| 21 | 3 | 5 | 30 | 20 | 850 × 1 + 920 × 2 | 3.6 | 210 | 1.7 | 9.2 | 4.5 | OK |
| *22 | 4 | 60 | 30 | — | 940 × 1 | 1.7 | 190 | 1.5 | 11.3 | 5.9 | OK |
| 23 | 4 | 60 | 30 | — | 860 × 1 + 930 × 1 | 4.5 | 245 | 2.2 | 11.4 | 5.9 | OK |
| 24 | 4 | 3 | 30 | 57 | 860 × 1 + 930 × 1 | 4.4 | 180 | 1.5 | 13.5 | 5.3 | OK |
| 25 | 4 | 5 | 30 | 55 | 940 × 1 | 4.4 | 210 | 1.7 | 13.3 | 5.3 | OK |
| *26 | 4 | 5 | 30 | 55 | 860 × 1 + 930 × 1 | 2.0 | 180 | 1.5 | 13.2 | 5.3 | OK |
| 27 | 4 | 10 | 30 | 50 | 860 × 1 + 930 × 1 | 4.5 | 240 | 1,9 | 12.8 | 5.5 | OK |
| 28 | 4 | 40 | 30 | 20 | 880 × 1 + 910 × 1 | 4.5 | 240 | 1.9 | 11.7 | 5.4 | OK |
| 29 | 4 | 60 | 30 | — | 880 × 1 + 910 × 1 | 5.3 | 270 | 2.2 | 11.2 | 5.5 | OK |
| 30 | 4 | 70 | 30 | — | 880 × 2 + 910 × 1 | 5.5 | 290 | 2.4 | 11.2 | 5.5 | OK |
| 31 | 4 | — | 30 | 30 | 880 × 1 + 910 × 1 | 5.4 | 280 | 2.4 | 12.0 | 5.5 | OK |
| 32 | 4 | — | 40 | 30 | 880 × 2 + 910 × 1 | 5.6 | 295 | 2.6 | 12.1 | 5.6 | OK |

Mark * shows the outside the scope of the invention.

As is clear from Table 4 and Table 5, the sintered bodies of the present invention containing an enstatite crystal having an average aspect ratio of at least 3 showed excellent characteristics in the points of the tenacity and strength as compared with the sintered bodies (Sample Nos. 1, 5, 12, 14, 17, 19, 22, and 26) having an aspect ratio of less than 3.

Also, as the results of the heat cycle tests, the wiring substrates using the sintered materials having a thermal expansion coefficient at a temperature of from 40° to 400° C. of at least 8 ppm/° C. could sufficiently endure the test up to 1,000 cycles.

What is claimed is:

1. A low-temperature calcined ceramic comprising a sintered body obtained by calcining a mixture of a glass and an SiO$_2$ filler, wherein the sintered body contains an SiO$_2$ crystal having an X-ray diffraction image in which the peak at the (101) plane of quartz or cristobalite is shifted at least 0.05° (2θ) to the lower angle side.

2. A low-temperature calcined ceramic of claim 1, wherein the SiO$_2$ filler is quartz or cristobalite.

3. A low-temperature calcined ceramic of claim 1, wherein the sintered body contains an enstatite crystal having an average aspect ratio of at least 3.

4. A wiring body comprising an insulating substrate having a metallized wiring layer formed on the surface or in the inside thereof, wherein the insulating substrate is made up of a sintered body obtained by calcining a mixture of a glass and an SiO$_2$ filler and the sintered body contains an SiO$_2$ crystal having an X-ray diffraction image in which the peak at the (101) plane of quartz or cristobalite is shifted at least 0.05° (2θ) to the lower angle side.

5. A wiring boad of claim 4, wherein the SiO$_2$ filler is quartz or cristobalite.

6. A mounted structure of a package for accommodating a semiconductor formed by connecting a package for accommodating a semiconductor having a wiring boad comprising an insulating substrate having a metallized layer formed on the surface or in the inside thereof, wherein the insulating substrate is made up of a sintered body obtained by calcining a mixture of a glass and an SiO$_2$ filler and the sintered material contains an SiO$_2$ crystal having an X-ray diffraction image that the peak at the (101) plane of quartz or cristobalite is shifted at least 0.05° (2θ) to the lower angle side.

7. A mounted structure of claim 6, wherein the SiO$_2$ filler is quartz or cristobalit.

* * * * *